US009142587B2

(12) United States Patent
Kobayashi

(10) Patent No.: US 9,142,587 B2
(45) Date of Patent: Sep. 22, 2015

(54) SOLID-STATE IMAGING DEVICE, MEMBERS FOR THE SAME, AND IMAGING SYSTEM

(75) Inventor: Masahiro Kobayashi, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 281 days.

(21) Appl. No.: 13/807,142

(22) PCT Filed: Jun. 21, 2011

(86) PCT No.: PCT/JP2011/003533
§ 371 (c)(1),
(2), (4) Date: Dec. 27, 2012

(87) PCT Pub. No.: WO2012/001911
PCT Pub. Date: Jan. 5, 2012

(65) Prior Publication Data
US 2013/0099098 A1  Apr. 25, 2013

(30) Foreign Application Priority Data
Jun. 30, 2010  (JP) .................... 2010-149485

(51) Int. Cl.
*H01L 27/146* (2006.01)
*H01L 23/48* (2006.01)

(52) U.S. Cl.
CPC ...... *H01L 27/14636* (2013.01); *H01L 27/1464* (2013.01); *H01L 27/14632* (2013.01); *H01L 27/14638* (2013.01); *H01L 23/481* (2013.01); *H01L 2924/0002* (2013.01)

(58) Field of Classification Search
CPC ............... H01L 27/1464; H01L 27/14636; H01L 27/14634
USPC .................. 250/208.1; 257/292, 432
See application file for complete search history.

(56) References Cited

U.S. PATENT DOCUMENTS

| 7,189,952 B2 * | 3/2007 | Guedj et al. ............... 250/208.1 |
| 2006/0146233 A1 * | 7/2006 | Park ............................... 349/95 |

FOREIGN PATENT DOCUMENTS

| JP | 2006-191081 A | 7/2006 |
| JP | 2008-536330 A | 9/2008 |
| JP | 2009-277732 A | 11/2009 |
| JP | 2009-541990 A | 11/2009 |

* cited by examiner

*Primary Examiner* — Tony Ko
(74) *Attorney, Agent, or Firm* — Canon USA, Inc. IP Division

(57) ABSTRACT

The present invention provides a solid-state imaging device including a pad capable of reducing inferior connection with an external terminal. The solid-state imaging device includes a first substrate provided, on its front face, with photoelectric conversion elements, a first wiring structure, a second substrate provided, on its front face, with at least a part of peripheral circuits, and a second wiring structure. The first substrate, the first wiring structure, the second wiring structure, and the second substrate are provided in this order. The first wiring structure includes a wiring layer including wirings made mainly of copper. The second wiring structure includes a wiring layer including wirings made mainly of copper. Wirings made mainly of copper in the first wiring structure are bonded with wirings made mainly of copper in the second wiring structure. The solid-state imaging device includes a pad formed of a conductive element made mainly of aluminum.

20 Claims, 8 Drawing Sheets

SOLID-STATE IMAGING DEVICE, MEMBERS FOR THE SAME, AND IMAGING SYSTEM

TECHNICAL FIELD

The present invention relates to a solid-state imaging device and more particularly to a pad.

BACKGROUND ART

With charge-coupled device (CCD)-type and amplifier-type solid-state imaging devices for digital still cameras and camcorders, miniaturization of pixels has been demanded to obtain high definition images. However, reducing the size of a pixel decreases the light-receiving area of a photoelectric conversion element for light detection included in the pixel, resulting in degraded sensitivity.

Patent Document 1 discloses an amplifier-type complementary metal-oxide semiconductor (CMOS) solid-state imaging device fabricated by bonding a first substrate provided with photoelectric conversion elements and transfer transistors, and a second substrate provided with other circuits to ensure the light-receiving area of a photoelectric conversion element. The first and second substrates are bonded with each other by using copper bonding pads.

Further, with the solid-state imaging device discussed in Patent Document 1, connecting portions penetrating the second substrate are connected with input/output pads for connection with external terminals from the back face of the second substrate. The input/output pads are formed after the second substrate has been ground to expose connecting portions.

CITATION LIST

Patent Literature

PTL 1: Japanese Patent Application Laid-Open No. 2006-191081

SUMMARY OF INVENTION

Technical Problem

However, Patent Document 1 discusses bonding by copper bonding pads but does not discuss in detail the material of the input/output pads. Depending on the material of the input/output pad, forming an oxide film on the input/output pad increases a contact resistance with an external terminal possibly causing inferior connection. Further, when connecting an input/output pad with an external terminal (wire bonding), exposing the face of the input/output pad may cause metal pollution.

The present invention is directed to a pad capable of preventing the occurrence of inferior connection with an external terminal and reducing the possibility of occurrence of metal pollution.

Solution to Problem

According to an aspect of the present invention, a solid-state imaging device includes: a first substrate provided with photoelectric conversion elements on its front face; a first wiring structure provided on the front face of the first substrate; a second substrate provided, on its front face, with at least a part of peripheral circuits including read-out circuits and control circuits for reading a signal based on electric charges of the photoelectric conversion elements; and a second wiring structure provided on the front face of the second substrate, wherein the first substrate, the first wiring structure, the second wiring structure, and the second substrate are provided in this order, wherein the first wiring structure includes a wiring layer including wirings made mainly of copper, wherein the second wiring structure includes a wiring layer including wirings made mainly of copper, wherein wirings made mainly of copper in the wiring layer in the first wiring structure are bonded with wirings made mainly of copper in the wiring layer in the second wiring structure, and wherein the solid-state imaging device include a pad for outputting a signal based on electric charges of the photoelectric conversion elements formed of a conductive element made mainly of aluminum.

According to another aspect of the present invention, a member for a solid-state imaging device includes: a substrate provided with photoelectric conversion elements on its front face; and a wiring structure provided on the front face of the substrate, the wiring structure including a wiring layer including wirings made mainly of copper, and a wiring layer including wirings made mainly of aluminum, wherein the wiring layer including wirings made mainly of aluminum is disposed closer to the substrate than the wiring layer including wirings made mainly of copper, and includes a pad for outputting a signal based on electric charges of the photoelectric conversion elements.

According to another aspect according to the present invention, a member for a solid-state imaging device includes: a substrate provided, on its front face, with at least a part of peripheral circuits including read-out circuits and control circuits; and a wiring structure provided on the front face of the substrate, the wiring structure including a wiring layer including wirings made mainly of copper, and a wiring layer including wiring made mainly of aluminum, wherein the wiring layer including wirings made mainly of aluminum is disposed closer to the substrate than the wiring layer including wirings made mainly of copper, and includes a pad for outputting a signal based on electric charges of the photoelectric conversion elements.

Advantageous Effects of Invention

The solid-state imaging device according to the present invention can provide a pad capable of restraining the occurrence of inferior connection with an external terminal and reducing the possibility of occurrence of metal pollution.

Further features and aspects of the present invention will become apparent from the following detailed description of exemplary embodiments with reference to the attached drawings.

BRIEF DESCRIPTION OF DRAWINGS

The accompanying drawings, which are incorporated in and constitute a part of the specification, illustrate exemplary embodiments, features, and aspects of the invention and, together with the description, serve to explain the principles of the invention.

DESCRIPTION OF EMBODIMENTS

Various exemplary embodiments, features, and aspects of the invention will be described in detail below with reference to the drawings.

The solid-state imaging device according to the present invention includes a first substrate provided with photoelectric conversion elements on its front face, a first wiring structure, a second substrate provided with at least a part of peripheral circuits on its front face, and a second wiring structure. The solid-state imaging device according to the present invention is provided with the first substrate, the first wiring structure, the second wiring structure, and the second substrate in this order. The first wiring structure includes a wiring layer including wirings made mainly of copper, and the second wiring structure includes a wiring layer including wirings made mainly of copper. At least the wirings made mainly of copper in the first wiring structure are bonded with the wirings made mainly of copper in the second wiring structure.

The solid-state imaging device according to the present invention includes a pad for outputting a signal based on electric charges of photoelectric conversion elements. In this case, the pad is a conductive element made mainly of aluminum. The above-mentioned wiring configuration enables restraining the occurrence of inferior pad connection, and reducing metal pollution due to copper.

Example 1

The present invention will be described in detail below with reference to the accompanying drawings. In the following descriptions of exemplary embodiments, the front face of the first substrate and the front face of the second substrate are substrate surfaces (principle planes) on which transistors are formed. For each of the first and second substrates, the face on the opposite side of the front face is the back face (read face). For each substrate, an upward direction refers to a direction from the back face to the front face, and a downward direction or depth direction refers to a direction from the front face to the back face. In the following descriptions, when the first and second substrates are bonded with each other, the back face of the second substrate is at the bottom face and the back face of the first substrate is at the top.

A first exemplary embodiment of the present invention will be described below with reference to FIGS. 1 to 6A and 6B.

First of all, a circuit of the solid-state imaging device according to the first exemplary embodiment will be described below with reference to FIG. 3. The present exemplary embodiment will be described below based on a case where, for example, electrons are used as signal charges.

Figure 3:
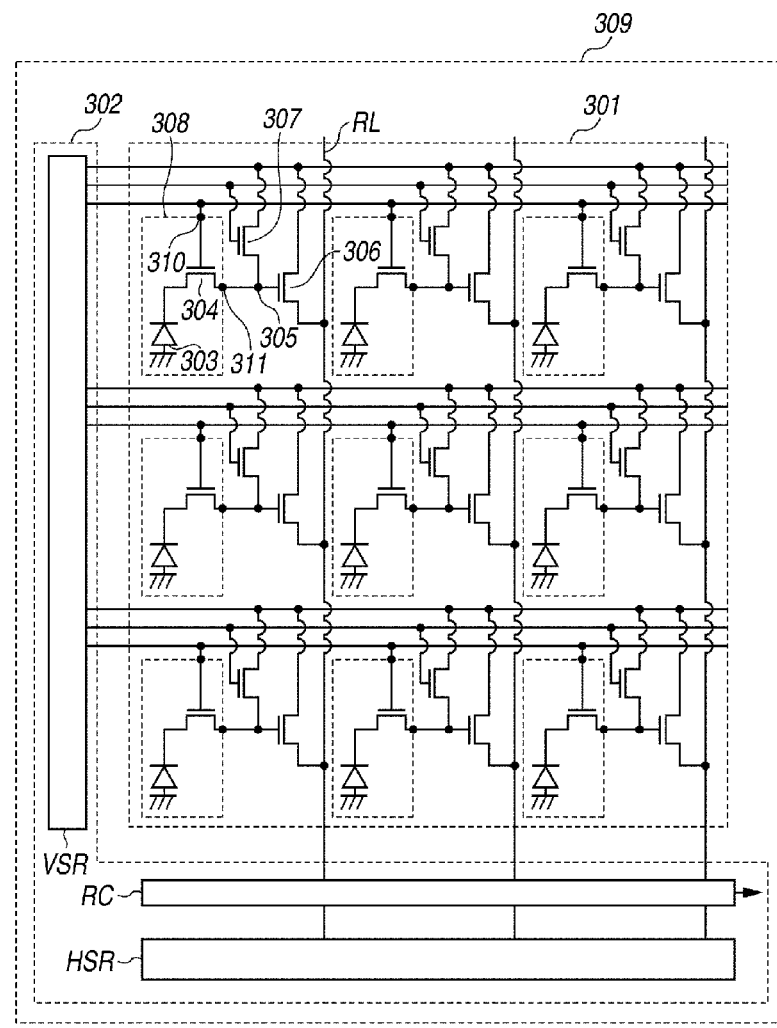
FIG. 3 is a circuit diagram of the solid-state imaging device according to the first exemplary embodiment.

The solid-state imaging device illustrated in FIG. 3 has a pixel portion 301 in which a plurality of photoelectric conversion elements is arranged. The solid-state imaging device illustrated in FIG. 3 includes a peripheral circuit portion 302 having peripheral circuits for generating a signal based on electric charges of the photoelectric conversion elements, including a control circuit for reading a signal from the pixel portion 301 and a signal processing circuit for processing the read signal. The peripheral circuit portion 302 is a region other than the pixel portion 301.

The pixel portion 301 is provided with a plurality of photoelectric conversion elements 303, transfer transistors 304, amplifier transistors 306, and reset transistors 307. A pixel is formed of at least one photoelectric conversion element 303. One pixel according to the present exemplary embodiment includes the photoelectric conversion element 303, the transfer transistor 304, the amplifier transistor 306, and the reset transistor 307.

The anode of the photoelectric conversion element 303 is grounded. The source of the transfer transistor 304 is connected with the cathode of the photoelectric conversion element 303, and the drain region of the transfer transistor 304 is connected with the gate electrode of the amplifier transistor 306. A node 305 is identical to the gate electrode of the amplifier transistor 306.

The reset transistor 307 is connected with the node 305, and the potential of the node 305 is set to any potential (for example, a reset potential). In this case, the amplifier transistor 306, a part of a source follower circuit, outputs a signal corresponding to the potential of the node 305 to a signal line RL. The node 305 may be referred to as a floating diffusion.

The peripheral circuit portion 302 indicates a region other than the pixel portion 301. The peripheral circuit portion 302 is provided with peripheral circuits including read-out circuits and control circuits. The peripheral circuits include vertical scanning circuits VSR which are control circuits for supplying a control signal to the gate electrodes of the transistors in the pixel portion 301.

The peripheral circuits also include read-out circuits RC which hold signals output from the pixel portion 301 and perform signal processing such as amplification, addition, and A/D conversion. The peripheral circuits also include horizontal scanning circuits HSR which are control circuits for controlling timing of sequentially outputting a signal from the read-out circuits RC.

The solid-state imaging device according to the first exemplary embodiment is formed of two members bonded with each other. The two members are a first member 308 including a first substrate 101, and a second member 309 including a second substrate 121. The first substrate 101 is provided with the photoelectric conversion elements 303 and the transfer transistors 304 of the pixel portion 301. The second substrate 121 is provided with the amplifier transistors 306 and the reset transistors 307 of the pixel portion 301, and the peripheral circuit portion 302.

A control signal is supplied from the peripheral circuit portion 302 of the second member 309 to the gate electrode of the transfer transistor 304 of the first member 308 via connecting portions 310. The configuration of the connecting portions 310 will be described below. A signal generated by the photoelectric conversion element 303 of the first member 308 is read out to the drain region of the transfer transistor 304, i.e., the node 305. The node 305 includes the elements provided on the first member 308 and the elements provided on the second member 309.

In comparison to a case where all pixel portions are provided on one member (one substrate), the above-mentioned configuration can provide a larger area of the photoelectric conversion element 303, and accordingly can improve the sensitivity. Further, in comparison to a case where all pixel portions are provided on one member (one substrate), the above-mentioned configuration can provide more number of photoelectric conversion elements 303 in the same area thereof, and accordingly can increase the number of pixels.

At least the photoelectric conversion elements 303 are preferably provided on the first substrate 101. The amplifier transistors 306 may be provided on the first substrate 101. Further, the photoelectric conversion elements 303 may be connected with the gate electrodes of the amplifier transistors 306 without providing the transfer transistors 304.

Further, a pixel may include additional elements such as an A/D conversion unit and capacitor. The use of the second substrate 121 makes it possible to provide additional elements without changing the area of the photoelectric conversion element 303. With the present invention, any selected elements can be provided on the first substrate 101, and any pixel configuration can be selected.

Figure 2A:
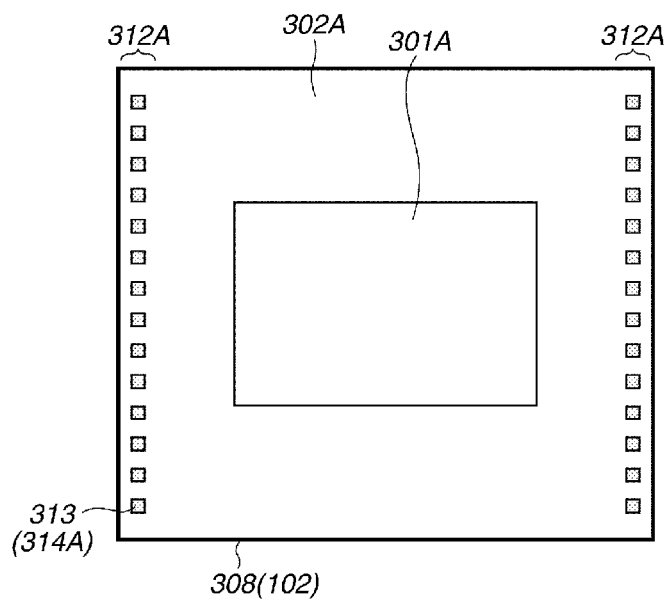
FIG. 2A is a plan view schematically illustrating the solid-state imaging device according to the first exemplary embodiment.
Figure 2B:
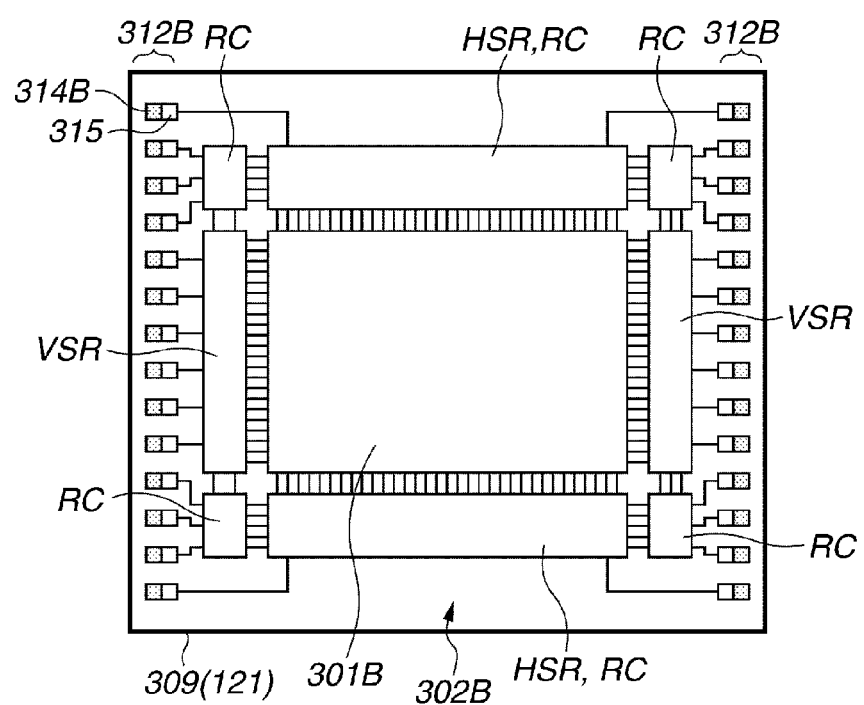
FIG. 2B is a plan view schematically illustrating the solid-state imaging device according to the first exemplary embodiment.

A planar layout of such a solid-state imaging device will specifically be described below with reference to the plan views schematically illustrated in FIGS. 2A and 2B. FIG. 2A illustrates a planar layout of the first member 308, i.e., the first substrate 101. FIG. 2B illustrates a planar layout of the second member 309, i.e., the second substrate 121.

Referring to FIG. 2A, the first member 308 is provided with a pixel portion 301A and pad portions 312A. The pixel portion 301A is provided with a plurality of photoelectric conversion elements. Each of the pad portions 312A is provided with a plurality of pads 313. The pixel portion 301A is provided with a plurality of photoelectric conversion elements 303, transfer transistors 304, and connecting portions 310 and 311 illustrated in FIG. 3. At the same planar position as the pad 313, the first member 308 is provided with a plurality of connecting portions 314A for connection with the second member 309.

An external terminal is connected to the pad 313. An exemplary external terminal is a bonding wire connected to the pad 313 by the wire bonding method. The solid-state imaging device is provided with a plurality of pads 313 such as pads (output pads) for outputting a signal (image signal) based on electric charges generated by the photoelectric conversion elements, and pads (input pads) for inputting voltages supplied from the outside to drive the peripheral circuits.

Referring to FIG. 2B, the second member 309 is provided with a pixel portion 301B, the peripheral circuit portion 302B, and pad portions 312B. The pixel portion 301B is provided with a part of pixel circuits, i.e., a plurality of amplifier transistors 306, reset transistors 307, and connecting portions 310 and 311 illustrated in FIG. 3.

The peripheral circuit portion 302B is provided with a part of peripheral circuits, i.e., horizontal scanning circuits HSR, vertical scanning circuits VSR, and read-out circuits RC. Each of the pad portions 312B is provided with a plurality of connecting portions 314B and protection diode circuits 315 for connection with the first member 308. Although the connecting portions 314B and the protection diode circuits 315 are illustrated at different planar positions, all or part of them may be provided at the same planar position.

The first member 308 and the second member 309 having the planar layouts illustrated in FIGS. 2A and 2B, respectively, are bonded with each other to form the solid-state imaging device according to the present exemplary embodiment. Specifically, the two members are arranged so that the pixel portions 301A and 301B are overlapped with each other. In this case, the connecting portions 314A are connected with respective connecting portions 314B, thus connecting the connecting portions 310 and 311 of the first member 308 with respective connecting portions 310 and 311 of the second member 309.

Referring to FIGS. 2A and 2B, the peripheral circuit portion 302A of the first member 308 corresponds to the peripheral circuit portion 302B of the second member 309. The peripheral circuit portion 302A may be provided with a part of the scanning circuits, i.e., a part of peripheral circuits.

Figure 1:
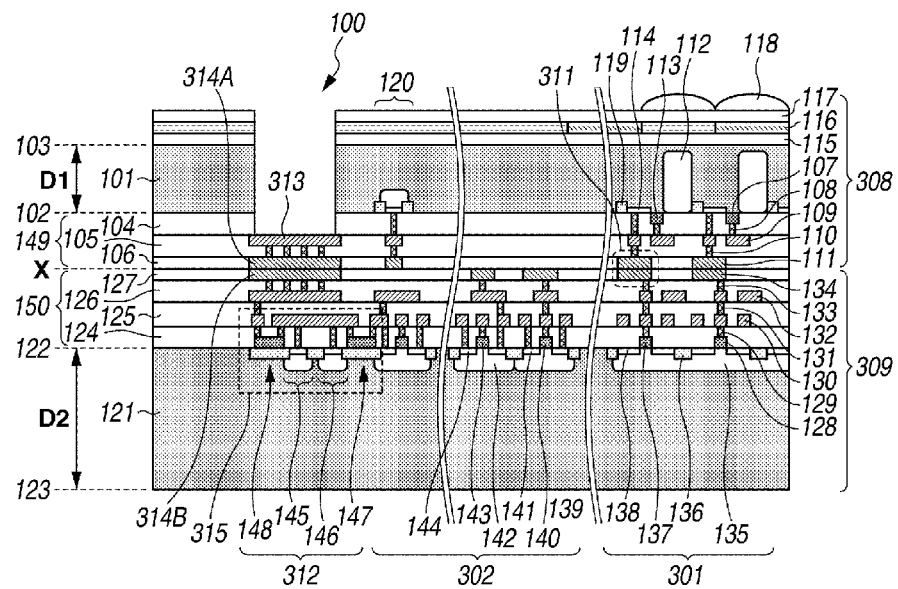
FIG. 1 is a cross-sectional view schematically illustrating a solid-state imaging device according to a first exemplary embodiment.

The schematic cross-sectional views of the solid-state imaging device illustrated in FIGS. 2A, 2B, and 3 will be described below with reference to FIG. 1. In FIG. 1, elements equivalent to those in FIGS. 2A, 2B, and 3 are assigned the same reference numerals and duplicated descriptions will be omitted.

The first member 308 includes a first wiring structure 149 and the first substrate 101. The first substrate 101, for example, a silicon semiconductor substrate, has a front face 102 and a back face 103. Transistors are provided on the front face 102 of the first substrate 101.

The first wiring structure 149 includes interlayer insulating films 104 to 106, a gate electrode layer 107 including a gate electrode and a wiring, wiring layers 109 and 111 including a plurality of wirings, and contact layers 108 and 110 including a plurality of contacts or vias. Any number of layers of the interlayer insulating films, wiring layers, and contact layers included in the first wiring structure 149 can be set. The wiring layer 111 in the first wiring structure 149 includes the connecting portions 314A, 310 and 311.

At the pixel portion 301 of the first member 308, the first substrate 101 is provided with an n-type semiconductor region 112 forming a photoelectric conversion element, an n-type semiconductor region 114 forming a drain of a transfer transistor, and an element separation structure 119. The transfer transistor is formed of the n-type semiconductor region 112, the n-type semiconductor region 114, and a gate electrode 113 included in the gate electrode layer 107.

Electric charges accumulated in the n-type semiconductor region 112 are transferred to the n-type semiconductor region 114 by the gate electrode 113. A potential based on electric charges transferred to the n-type semiconductor region 114 is transmitted to the second member 309 via a contact in the contact layer 108, a wiring in the wiring layer 109, a via in the contact layer 110, and a wiring in the wiring layer 111.

A wiring in the wiring layer 111 form the connecting portions 311. The photoelectric conversion element may be a pinned photodiode including a p-type semiconductor region or may be a photogate, and can be suitably changed.

The back face 103 of the first substrate 101 at the pixel portion 301 is provided with a planarization layer 115, a color filter layer 116 including a plurality of color filters, a planarization layer 117, and a microlens layer 118 including a plurality of microlenses, in this order.

Referring to FIG. 1, each of the plurality of color filters and each of the plurality of microlenses correspond to each photoelectric conversion element, i.e., they are provided for each pixel. However, one color filter and one microlens may be provided for a plurality of pixels. The solid-state imaging device according to the present exemplary embodiment is a backside-illumination type solid-state imaging device with which light is input from the side of the microlens layer 118 and received by the photoelectric conversion element.

The pad portion 312 of the first member 308 is provided with a pad 313 and an opening 100 for exposing the pad 313 for connection with an external terminal. The pad portion 312 is also provided with a connecting portion 314A for transmitting a voltage input from the pad 313 to the second member 309. A region of the first member 308 corresponding to the peripheral circuit portion 302 of the second member 309 is provided with arbitrary circuit elements 120, as illustrated in FIG. 1.

The second member 309 includes a second wiring structure 150 and the second substrate 121. The second substrate 121, for example, a silicon semiconductor substrate, has a front face 122 and a back face 123. Transistors are provided on the front face 122 of the second substrate 121.

The second wiring structure 150 includes interlayer insulating films 124 to 127; a gate electrode layer 128 including gate electrodes and wirings; wiring layers 130, 132, and 134 including a plurality of wirings; and contact layers 129, 131, and 133 including a plurality of contacts or vias. Any number of layers of the interlayer insulating films, wiring layers, and contact layers included in the second wiring structure 150 can be set. The wiring layer 134 in the second wiring structure 150 includes the connecting portions 314B, 310 and 311.

At the pixel portion 301 of the second member 309, the second substrate 121 is provided with a well 135 forming an amplifier transistor forming a pixel circuit, an n-type semiconductor region 138 forming source and drain regions of the amplifier transistor, and an element separation structure 136. An amplifier transistor, provided in the well 135, is formed of a gate electrode 137 included in the gate electrode layer 128 and an n-type semiconductor region 138 forming source and drain regions.

The connecting portion 311 of the first member 308 is connected with the gate electrode 137 of the amplifier transistor through a wiring in the wiring layer 134, a via in the contact layer 133, a wiring in the wiring layer 132, a via in the contact layer 131, a wiring in the wiring layer 130, and a contact in the contact layer 129.

The node 305 illustrated in FIG. 3 is formed of the n-type semiconductor region 114; wirings in the wiring layers 109, 111, 134, 132, and 130; contacts or vias in the contact layers 108, 110, 133, 131, and 129; and the gate electrode 137, illustrated in FIG. 1. In FIG. 3, other circuits (for example, a reset transistor) at the pixel portion 301 are not illustrated.

The peripheral circuit portion 302 of the second member 309 is provided with at least a part of peripheral circuits including read-out circuits and control circuits such as horizontal scanning circuits HSR and vertical scanning circuits VSR. FIG. 1 illustrates n-type transistors and p-type transistors in any circuit included in peripheral circuits. A p-type well 139 is provided with an n-type transistor formed of a gate electrode 140 included in the gate electrode layer 128 and n-type source and drain regions 141.

An n-type well 142 is provided with a p-type transistor formed of a gate electrode 143 included in the gate electrode layer 128, and a p-type semiconductor region 144 forming p-type source and drain regions.

The pad portion 312 of the second member 309 is provided with the protection diode circuit 315 for inputting a signal from the pad 313 of the first member 308 and a connecting portion 314B for connection with the first member 308. The protection diode circuit 315 according to the present exemplary embodiment includes two diodes 145 and 146 formed of semiconductor regions, and two resistors 147 and 148 formed of the gate electrode layer 128. However, an ordinary protection diode circuit can be applied as the protection diode circuit 315.

With the solid-state imaging device according to the present exemplary embodiment, the front face 102 of the first substrate 101 and the front face 122 of the second substrate 121 are arranged so that they face each other (opposing arrangement) to sandwich the first wiring structure 149 and the second wiring structure 150. Specifically, the first substrate 101, the first wiring structure 149, the second wiring structure 150, and the second substrate 121 are arranged in this order.

In other words, the upper face of the first wiring structure 149 is bonded with the upper face of the second wiring structure 150 at a bonding face X. Specifically, the first member 308 and the second member 309 are bonded with each other at the bonding face X. The bonding face X is formed of the upper face of the first wiring structure 149 and the upper face of the second wiring structure 150.

As a result, the first wiring structure 149 and the second wiring structure 150 integrally form the wiring structure between the first substrate 101 and the second substrate 121. The pad 313 of the solid-state imaging device for exchanging a signal with the outside is provided at the top of the front face 122 of the second member 309, and the opening 100 is provided on the side of the first member 308.

With the first wiring structure 149, the wiring layer 109 is formed of wirings (aluminum wirings) made mainly of aluminum, and the wiring layer 111 is formed of wirings (copper wirings) made mainly of copper. With the second wiring structure 150, the wiring layer 131 and the wiring layer 132 are formed of aluminum wirings, and the wiring layer 134 is formed of copper wirings.

At the bonding face X, the connecting portion 311 and the connecting portion 314A included in the wiring layer 111 formed of copper wirings are respectively bonded with the connecting portion 311 and the connecting portion 314B included in the wiring layer 134 formed of copper wirings. In other words, this bonding portion is formed of two wiring layers having a thickness for the two layers.

The wiring structure formed of the first wiring structure 149 and the second wiring structure 150 is provided with wiring layers formed of wirings made mainly of aluminum respectively disposed at the first substrate 101 side and the second substrate 121 side of the wiring layers (connecting portions) formed of wirings made mainly of copper. In other words, the wiring layers (connecting portions) made mainly of copper are sandwiched by the upper and lower wiring layers formed of wirings made mainly of aluminum.

The pad 313 for connection with an external terminal is provided in the same layer as the wiring layer 109, i.e., at the same height. The pad 313 is a conductive element made mainly of aluminum. Providing the pad 313 formed of a conductive element made mainly of aluminum enables restraining the occurrence of inferior connection with an external terminal thereat.

For example, when the pad 313 is made of copper, an oxide is easily formed at the surface to cause inferior contact when it is connected with an external terminal (wire bonding). Further, when the copper face is exposed for connection with an external terminal, copper diffuses in the solid-state imaging device to cause metal pollution, and possibly resulting in noise.

Further, providing the pad 313 in the same layer as the wiring layer 109 (at the same height) enables forming it with the same step in the process as wirings in the wiring layer 109, facilitating fabrication processes. The height refers to a height from the front face 102 of the first substrate 101.

Figure 4A:
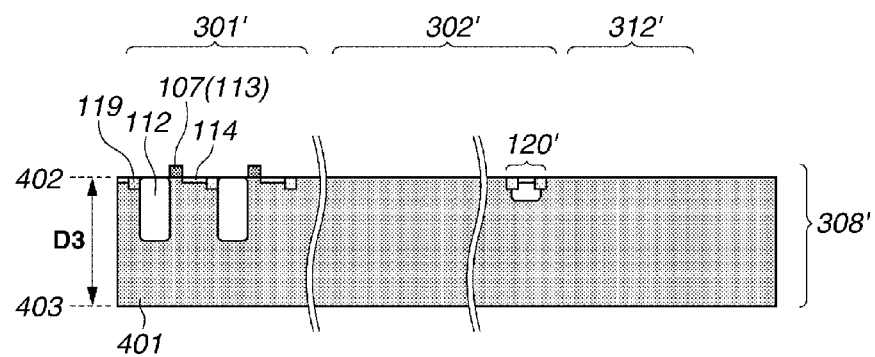
FIG. 4A is a cross-sectional view schematically illustrating a method for fabricating the solid-state imaging device according to the first exemplary embodiment.
Figure 4B:
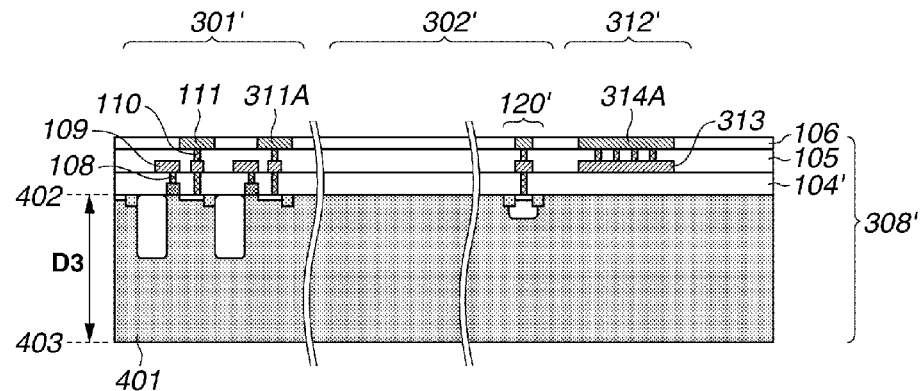
FIG. 4B is a cross-sectional view schematically illustrating a method for fabricating the solid-state imaging device according to the first exemplary embodiment.
Figure 5A:
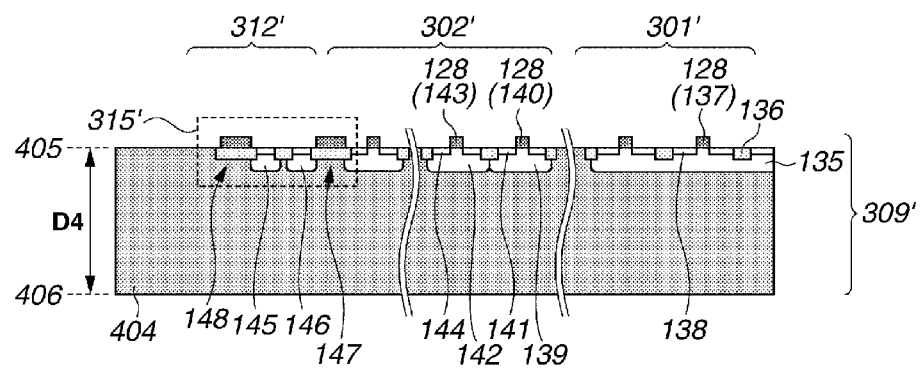
FIG. 5A is a cross-sectional view schematically illustrating a method for fabricating the solid-state imaging device according to the first exemplary embodiment.
Figure 5B:
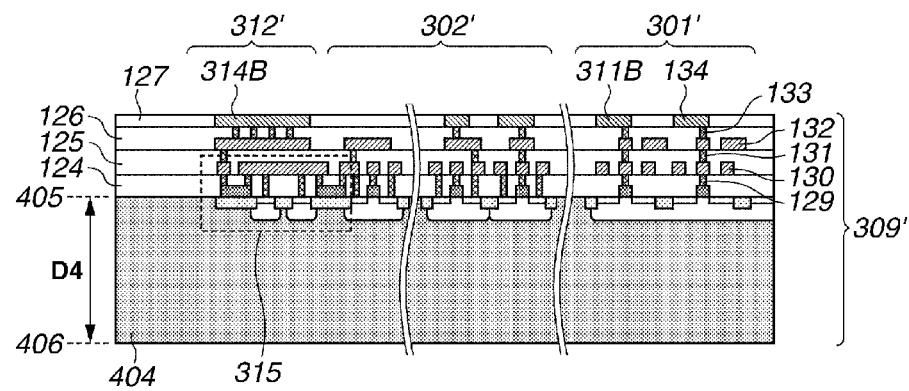
FIG. 5B is a cross-sectional view schematically illustrating a method for fabricating the solid-state imaging device according to the first exemplary embodiment.
Figure 6A:
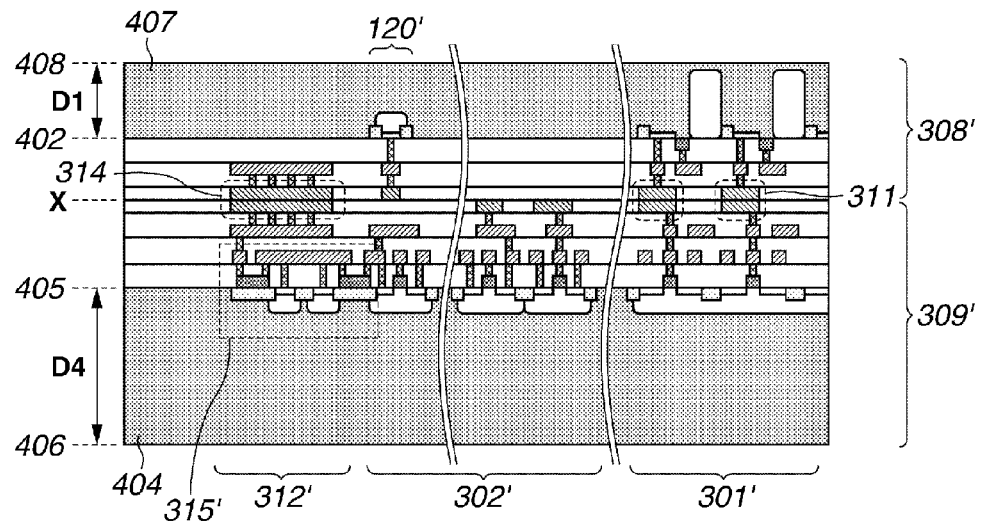
FIG. 6A is a cross-sectional view schematically illustrating a method for fabricating the solid-state imaging device according to the first exemplary embodiment.
Figure 6B:
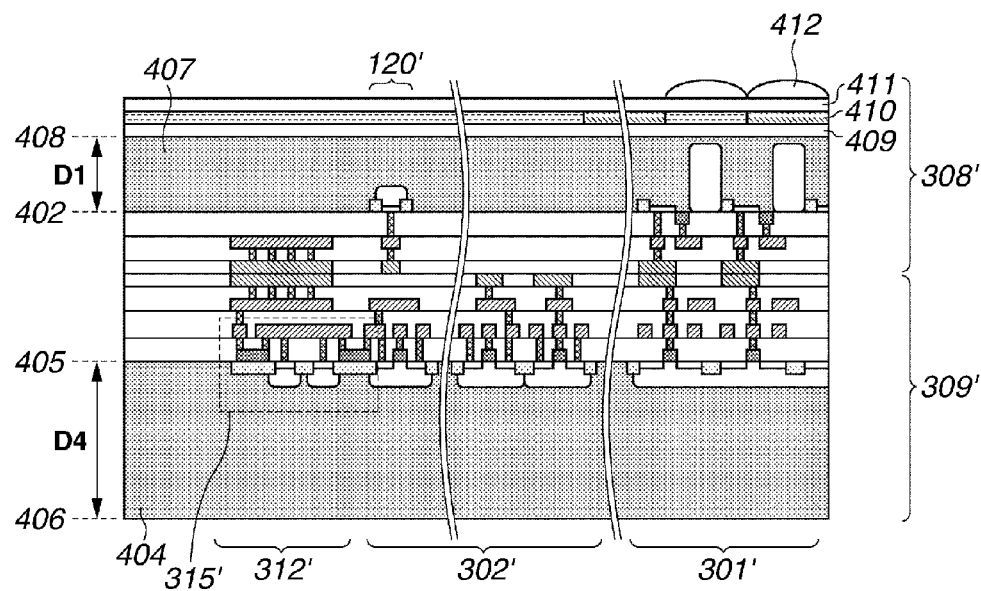
FIG. 6B is a cross-sectional view schematically illustrating a method for fabricating the solid-state imaging device according to the first exemplary embodiment.

Processes for fabricating the solid-state imaging device according to the present exemplary embodiment will be described below with reference to FIGS. 4A, 4B, 5A, 5B, 6A, and 6B. FIGS. 4A and 4B are cross-sectional views schematically illustrating a process for fabricating the first member 308. FIGS. 5A and 5B are cross-sectional views schematically illustrating a process for fabricating the second member 309. FIGS. 6A and 6B are cross-sectional views schematically illustrating a process for fabricating the solid-state imaging device after the first member 308 and the second member 309 have been bonded with each other.

The process for fabricating the first member 308 will be described below with reference to FIGS. 4A and 4B. A configuration 308' illustrated in FIGS. 4A and 4B is to be formed into the first member 308 illustrated in FIG. 1. Likewise, portions 301', 302', 312', and 120' are to be respectively formed into the pixel portion 301, the peripheral circuit portion 302, the pad portion 312, and a circuit element 120 (a part of the peripheral circuit portion 302) illustrated in FIG. 1.

A semiconductor substrate is prepared first, and then the following elements are formed on the semiconductor substrate. A semiconductor substrate 401 having a thickness D3, a front face 402, and a back face 403 is prepared. The semiconductor substrate 401 is, for example, a silicon semiconductor substrate.

An element separation structure 119 is formed on the semiconductor substrate 401. The element separation structure 119 includes an insulator such as a silicon oxide film, for example, has the Local Oxidation of Silicon (LOCOS) and Shallow Trench Isolation (STI) structures. A well of any conductive type (not illustrated) is formed in the semiconductor substrate 401. Subsequently, n-type semiconductor regions 112 and 114 for forming photoelectric conversion elements and transistors, and p-type semiconductor regions (not illustrated) are formed.

Then, a gate electrode layer 107 including gate electrodes including the gate electrode 113 of a transfer transistor is formed. The gate electrode layer 107 is formed, for example, by depositing and patterning polysilicon layers, and may include not only gate electrodes but also wirings. The above-mentioned gate electrodes, element separation structures, and semiconductor regions can be formed by the ordinary semiconductor fabrication processes and therefore detailed descriptions on relevant fabrication processes will be omitted. Thus, the configuration illustrated in FIG. 4A is obtained.

Then, a wiring structure is formed on the front face 402 of the semiconductor substrate 401. The wiring structure includes interlayer insulating films 104', 105, and 106; contact layers 108 and 110; and wiring layers 109 and 111. The interlayer insulating film 104' is to be formed into the interlayer insulating film 104 illustrated in FIG. 1. The interlayer insulating film 104' covers the gate electrode layer 107. The contact layer 108 is provided in the interlayer insulating film 104'. The wiring layer 109 is provided on the interlayer insulating film 104'.

The interlayer insulating film 105 covers the wiring layer 109. The contact layer 110 is provided in the interlayer insulating film 105. The wiring layer 111 is provided on the interlayer insulating film 105. The interlayer insulating film 106 is provided on the interlayer insulating film 105, and has an opening for exposing wirings in the wiring layer 111. The upper face of the wiring structure is formed of the upper face of the interlayer insulating film 106 and the upper face of the wiring layer 111.

The interlayer insulating films 104', and 105 and 106 are silicon oxide films. However, the interlayer insulating film 104', 105, and 106 may be formed of silicon nitrided films or organic resin. The contact 108 and the via 110 are made of, for example, tungsten. The wiring layer 109 is formed of wirings made mainly of aluminum. The wiring layer 111 is formed of wirings made mainly of copper.

The wiring layer 111 includes the connecting portions 314A and 311A. The wiring layer 109 includes the pad 313. Wirings made mainly of copper in a wiring layer can be formed by forming grooves in an interlayer insulating film by using the single-damascene method and then embedding a barrier metal and copper into the grooves. Wirings made mainly of aluminum in a wiring layer can be formed by patterning a barrier metal and aluminum film, formed on an interlayer insulating film, by using photolithography and etching techniques.

The above-mentioned wiring layers, contact layers, and interlayer insulating films can be formed by the ordinary semiconductor fabrication processes and therefore detailed descriptions thereof will be omitted. Thus, the configuration illustrated in FIG. 4B is obtained. Portions 104', 105, 106, and 108 to 111 illustrated in FIG. 4B are to be formed into the first wiring structure 149 illustrated in FIG. 1. The connecting portion 311A is to be formed into the connecting portions 311.

The process for fabricating the second member 309 illustrated in FIG. 1 will be described below with reference to FIGS. 5A and 5B. A portion 309' illustrated in FIGS. 5A and 5B is to be formed into the second member 309 illustrated in FIG. 1. Likewise, portions 301', 302', 312', and 315' are to be respectively formed into the pixel portion 301, the peripheral circuit portion 302, the pad portion 312, and the protection diode circuit 315 illustrated in FIG. 1.

A semiconductor substrate is prepared first, and then the following elements are formed on the semiconductor substrate. A semiconductor substrate 404, with a thickness D4, having a front face 405, and a back face 406 is prepared. The element separation structure 136 is formed on the semiconductor substrate 404 by using the LOCOS and STI structures. The p-type wells 135 and 139 and the n-type well 142 are formed in the semiconductor substrate 404.

Subsequently, semiconductor regions for forming a transistor, i.e., the n-type semiconductor regions 138 and 141 to be formed into source and drain regions, and the p-type semiconductor region 144, are formed. Further, a semiconductor region for forming a diode is formed. Then, the gate electrode layer 128 including the gate electrodes 137, 140, and 143 for transistors and wirings (resistors) is formed by depositing and patterning polysilicon layers.

The above-mentioned gate electrodes, element separation structures, and semiconductor regions can be formed by the ordinary semiconductor fabrication processes and therefore detailed descriptions thereof will be omitted. Thus, the configuration illustrated in FIG. 5A is obtained.

Then, a wiring structure is formed on the front face 405 of the semiconductor substrate 404. The wiring structure includes the interlayer insulating films 124 to 127; the contact layers 129, 131, and 133; and the wiring layers 130, 132, and 134. The interlayer insulating film 124 covers the gate electrode layer 128. The contact layer 129 is provided in the interlayer insulating film 124. The wiring layer 130 is provided on the interlayer insulating film 124.

The interlayer insulating film 125 covers the wiring layer 130. The contact layer 131 is provided in the interlayer insulating film 125. The wiring layer 132 is provided on the interlayer insulating film 125. The interlayer insulating film 126 covers the wiring layer 132, and is provided on the interlayer insulating film 125.

The contact layer 133 is provided in the interlayer insulating film 126. The wiring layer 134 is provided on the interlayer insulating film 126. The interlayer insulating film 127 is provided on the interlayer insulating film 126, and has an opening for exposing wirings in the wiring layer 134. The upper face of the wiring structure is formed of the upper face of the interlayer insulating film 127 and the upper face of the wiring layer 134.

The interlayer insulating films 124 to 127 are silicon oxide films. The interlayer insulating films 124 to 127 may be formed of silicon nitrided films or organic resin. The contact 129 and the vias 131 and 133 are formed of, for example, tungsten. The wiring layers 130 and 132 are formed of wirings made mainly of aluminum. The wiring layer 134 is formed of wirings made mainly of copper.

The wiring layer 134 includes the connecting portions 314B and 311B. Wirings made mainly of copper in a wiring layer can be formed by forming grooves on an interlayer insulating film by using the single-damascene method and then embedding a barrier metal and copper into the grooves. Wirings made mainly of aluminum in a wiring layer can be formed by patterning a barrier metal and aluminum film, formed on an interlayer insulating film, by using photolithography and etching techniques.

The above-mentioned wiring layers, contact layers, and interlayer insulating films can be formed by the ordinary semiconductor fabrication processes and therefore detailed descriptions thereof will be omitted.

Thus, the configuration illustrated in FIG. 5B is obtained. Portions 124 to 127 and 129 to 134 illustrated in FIG. 5B are to be formed into the second wiring structure 150 illustrated in FIG. 1. The connecting portion 311B is to be formed into the connecting portions 311.

The first member 308' illustrated in FIG. 4B and the second member 309' illustrated in FIG. 5B are bonded with each other so that the front faces 402 and 405 of respective semiconductor substrates face each other. Specifically, the uppermost face of the wiring structure of the first member 308' is bonded with the uppermost face of the wiring structure of the second member 309'.

Since the connecting portions 311 and the connecting portions 209A and 209B are formed of wirings made mainly of copper, these connecting portions can be bonded by copper metal bonding. At the connecting portions, the contacts 110 and 133 are connected on the side of the first substrate 101 and the second substrate 121, respectively. Plugs (tungsten) of the contacts 110 and 133 directly contact the connecting portions.

Between the contact 110 and the wiring layer 109, the barrier metal for tungsten of the plug of the contact 110 contacts the wiring layer 109. Likewise, between the contact 133 and the wiring layer 134, the bather metal for tungsten of the plug of the contact 113 contacts the wiring layer 133.

After the first member 308' and the second member 309' have been bonded with each other, the back face 403 of the semiconductor substrate 401 of the first member 308' is thinned. Thinning can be performed by chemical mechanical polishing (CMP) and/or etching. The semiconductor substrate 401 is to be formed into the semiconductor substrate 407 illustrated in FIG. 6A. Accordingly, the thickness D3 is to be changed to thickness D1 (D1<D3) illustrated in FIG. 6A.

Thus, thinning the semiconductor substrate 401 to form the semiconductor substrate 407 subsequently enables incidence light to be efficiently input to photoelectric conversion elements. In this case, the thickness D1 of the semiconductor substrate 407 is smaller than the thickness D4 of the semiconductor substrate 404.

Then, a planarization layer 409 made of resin, a color filter layer 410, a planarization layer 411 made of resin, and a microlens layer 412 are formed on the back face 408 of the semiconductor substrate 407 in this order. The above-mentioned planarization layers, color filter layers, and microlens layers can be formed by the ordinary semiconductor fabrication processes and therefore detailed descriptions thereof will be omitted. The microlens layer 412 may be formed up to the region 312' to be formed into the pad portion 312. Thus, the configuration illustrated in FIG. 6B is obtained.

Then, the opening 100 is formed to expose the pad 313. A photoresist mask having any opening is provided on the microlens layer 412 by using photolithography technique. Then, by using dry etching technique, the microlens layer 421, the planarization layer 411, the color filter layer 410, the planarization layer 409, the semiconductor substrate 407, and the interlayer insulating film 104' are removed to form the opening 100 to expose the pad 313.

Then, the microlens layer 118, the planarization layers 117 and 115, the color filter layer 116, the first substrate 101, and the interlayer insulating film 104 are formed. Thus, the configuration illustrated in FIG. 1 is obtained. The semiconductor substrate 404, the front face 405, the back face 406, and the thickness D4 illustrated in FIG. 6B corresponds to the second substrate 121, the front face 122, the back face 123, and the thickness D2 illustrated in FIG. 1, respectively.

Although the thicknesses D4 and D2 remain unchanged, the semiconductor substrate 404 may be thinned so that the thickness D2 becomes smaller than the thickness D4. The thinning process enables miniaturization of the solid-state imaging device although the number of processes increases.

As mentioned above, since the pad 313 is formed of a metal made mainly of aluminum, the pad 313 is unlikely to be influenced by oxidation in comparison to a case of a metal made mainly of copper, the contact resistance with an external terminal can be reduced. Further, since the pad 313 is formed of a metal made mainly of aluminum, the possibility of occurrence of metal pollution can be reduced in comparison to a case of a metal made mainly of copper.

In the present exemplary embodiment, the wiring included in the wiring layer closest to the front face of the first substrate 101 serves as a pad. The above-mentioned configuration enables forming the pad 313 with the same processes as wirings in the wiring layer 109, accordingly facilitating fabrication processes.

Performing the etching process for exposing the pad 313 from the back face 408 of the thinned semiconductor substrate 407 can shorten the time necessary for etching for forming the pad 313. In the etching process, the pad 313 can serve also as an etching stopper. Microlenses can be subsequently formed, thus facilitating subsequent processes.

Further, the wiring layer closest to the front face of the first substrate 101 is formed of a metal made mainly of aluminum. Since this configuration does not use a metal made mainly of copper (which is more likely to diffuse than aluminum) as the layer closest to the photoelectric conversion element, the influence of metal pollution on the photoelectric conversion element can be reduced to prevent noise in the solid-state imaging device.

The method for fabricating the solid-state imaging device according to the present exemplary embodiment is not limited to the above-mentioned processes. The order of processes may be changed. The order of fabricating the first member 308 and the second member 309 can be suitably set. A Silicon-on-Insulator (SOI) substrate can be applied as the semiconductor substrates 401 and 402.

The solid-state imaging device can also be formed by bonding the first member 308 and the second member 309 separately provided as substrates therefor. For example, the first member 308 includes the first substrate 101, and the first wiring structure 149 including wiring layers including wirings made mainly of copper and wiring layers including wirings made mainly of aluminum. In this case, wiring layers including wirings made mainly of aluminum are disposed closer to the first substrate 101 than wiring layers including wirings made mainly of copper. A wiring layer may include a pad.

For example, the second member 309 includes the second substrate 121, and the second wiring structure 150 including wiring layers including wirings made mainly of copper, and wiring layers including wirings made mainly of aluminum. In this case, wiring layers including wirings made mainly of aluminum are disposed closer to the second substrate 121 than wiring layers including wirings made mainly of copper. A wiring layer may include a pad. The solid-state imaging device according to the present exemplary embodiment can also be fabricated by suitably providing the above-mentioned first and second members.

Figure 7A:
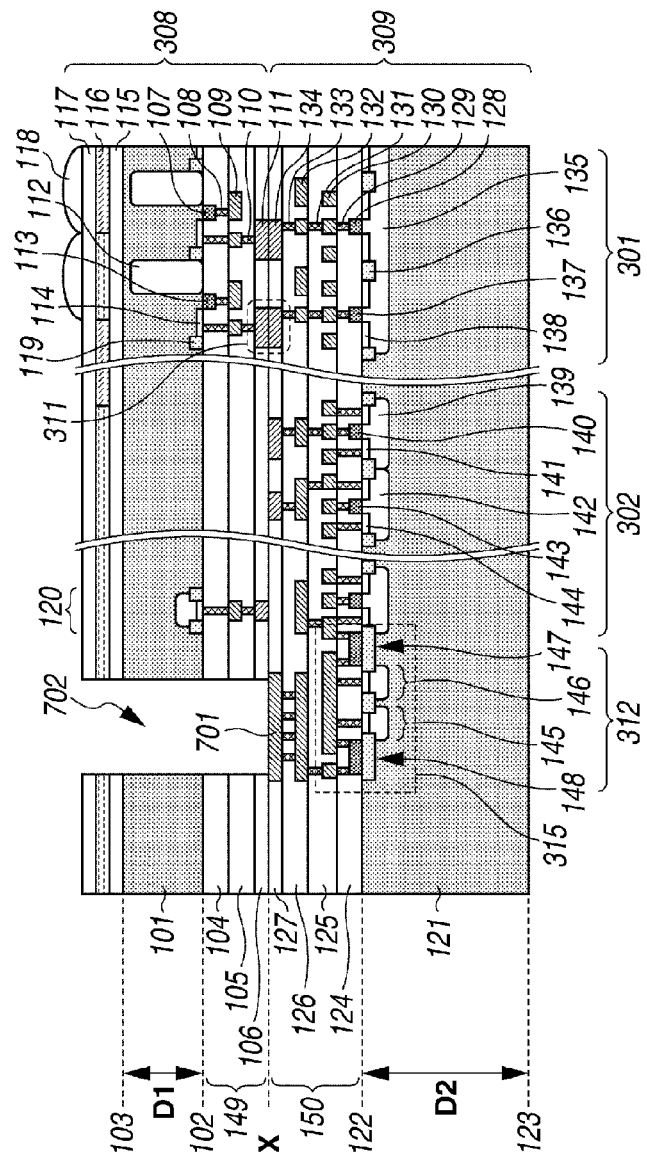
FIG. 7A is a cross-sectional view schematically illustrating a modification of the solid-state imaging device according to the first exemplary embodiment.
Figure 7B:
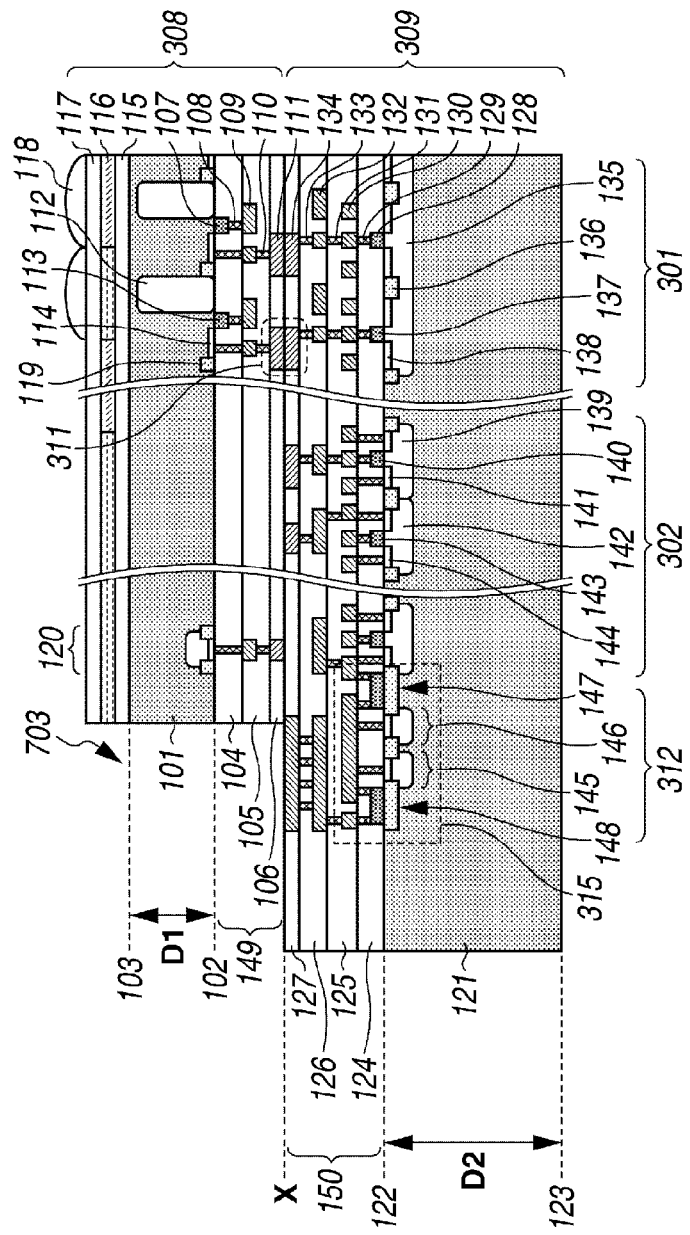
FIG. 7B is a cross-sectional view schematically illustrating a modification of the solid-state imaging device according to the first exemplary embodiment.
Figure 7C:
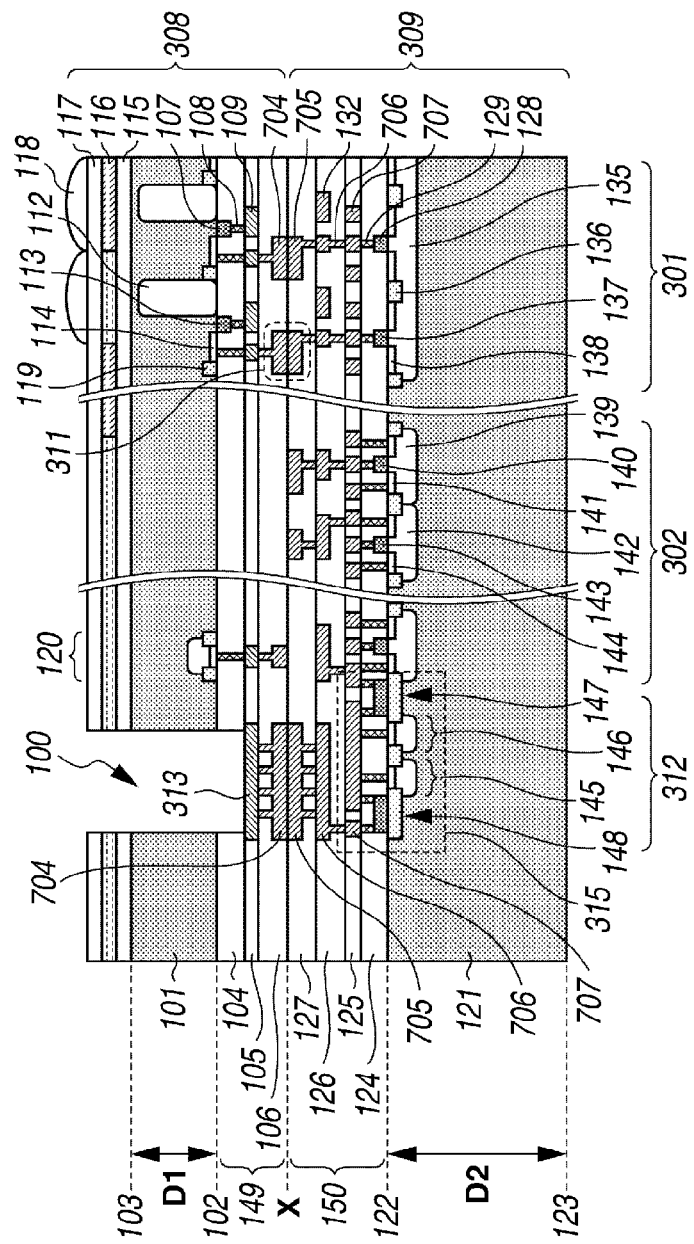
FIG. 7C is a cross-sectional view schematically illustrating a modification of the solid-state imaging device according to the first exemplary embodiment.

Modifications of the first exemplary embodiment will be described below with reference to FIGS. 7A to 7C. FIGS. 7A to 7C are cross-sectional views schematically illustrating modifications of the solid-state imaging device according to the first exemplary embodiment. Each of FIGS. 7A to 7C corresponds to FIG. 1. In FIGS. 7A, 7B, and 7C, elements equivalent to those in FIG. 1 are assigned the same reference numerals and duplicated descriptions will be omitted.

A modification illustrated in FIG. 7A differs from the first exemplary embodiment illustrated in FIG. 1 in opening and pad configuration. Specifically, the modification as the present exemplary embodiment includes an opening 702 and a pad 701. The present exemplary embodiment includes the opening 702, which is deeper than the opening 100 in the first exemplary embodiment, and the pad 701, which is disposed closer to the front face 122 of the second member 309 than the pad 313 of the first exemplary embodiment is. A pad can be provided at any position in this way.

The pad 701 is provided in the same layer as the wiring layer 134 provided on the second substrate 121, and is formed of a conductive element made mainly of aluminum. The wiring layer 134 is formed of wirings made mainly of copper. The pad 701 is formed of a wiring made mainly of aluminum to enable reducing inferior connection with an external terminal. Since the pad 701 is formed in the same layer as the wiring layer 134, the modification provides simpler fabrication processes than the configuration discussed in Patent Document 1.

The process for fabricating the modification illustrated in FIG. 7A differs from the first exemplary embodiment in the process according to the first exemplary embodiment illustrated in FIG. 5B. First of all, after layers up to the interlayer insulating film 126 have been formed, a barrier metal film, an aluminum film, and a barrier metal film are stacked on the interlayer insulating film 126 in this order. The stacked films are patterned with photolithography technique to form the pad 701. An insulating film, which is to be formed into the interlayer insulating film 127, is formed to cover the pad 701 aiming at planarization.

Then, by using the single-damascene method, the wiring layer 134 made mainly of copper is formed in the insulating film which is to be formed into the interlayer insulating film 127. At the same time as when the wiring layer 134 has been formed, the insulating film is ground to be formed into the interlayer insulating film 127. Subsequent processes are similar to those according to the first exemplary embodiment illustrated in FIGS. 6A and 6B. Thus, the configuration illustrated in FIG. 7A can be formed.

An opening 703 in a modification illustrated in FIG. 7B differs in shape from the opening 100 according to the first exemplary embodiment. Other configurations in FIG. 7B are similar to those illustrated in FIG. 7A. Specifically, as illustrated in FIG. 7B, unnecessary interlayer insulating films and semiconductor substrates may be removed.

A modification illustrated in FIG. 7C differs from the first exemplary embodiment in wiring form of the wiring structures provided on the first member 308 and the second member 309. The modification illustrated in FIG. 7C differs from the first exemplary embodiment illustrated in FIG. 1 in via and wiring layer configuration. Specifically, the vias 110, 131, and 133, and wiring layers 111, 130, 132, and 134 according to the first exemplary embodiment are changed to damascene structures 704 to 707.

The damascene structure includes the single-damascene structure formed by the single-damascene method and the dual-damascene structure formed by the dual-damascene method. With the single-damascene structure, conductive elements and barrier metals to be formed into wirings are embedded in any insulating film. With the dual-damascene structure, conductive elements and bather metals to be formed into wirings and plugs are embedded in any insulating film. A plug forms a via and a contact.

Referring to FIG. 7C, the dual-damascene structure 704 is provided corresponding to the vias 110 and the wiring layer 111 illustrated in FIG. 1, and the single-damascene structure 707 is provided corresponding to the wiring layer 130 illustrated in FIG. 1. Referring to FIG. 7C, the dual-damascene structure 706 is provided corresponding to the vias 131 and the wiring layer 132 illustrated in FIG. 1, and the dual-damascene structure 706 is provided corresponding to the vias 133 and the wiring layer 134 illustrated in FIG. 1.

The wiring layer 109 in the same layer as the pad 313 is formed of wirings made mainly of aluminum. The pad 313 can be formed in the same process as the wiring layer 109, accordingly facilitating fabrication processes. Thus, at least the wiring layer closest to the first substrate 101 provided with photoelectric conversion elements may be formed of wirings made mainly of aluminum, and other wiring layers may be formed of wirings made main of copper.

Metal pollution can be reduced by forming with wirings made mainly of aluminum the wiring layer closest to the first substrate 101. Thus, any configuration can be applied to wiring structures.

Further, in each exemplary embodiment, although a part of the first substrate 101 is removed to expose a pad, a part of the second substrate 121 may be removed to expose the pad. After a part of the second substrate 121 has been removed, microlenses are formed on the back face of the first substrate 101 to enable fabricating the present exemplary embodiment. In that case, the second wiring structure 150 may include a pad made mainly of aluminum, and the first wiring structure 149 may include a pad made mainly of aluminum. However, as mentioned above, it is more desirable to remove a part of the first substrate 101 because of the ease of fabrication.

As an exemplary application of the solid-state imaging device according to each of the above-mentioned exemplary embodiments, an imaging system including the solid-state imaging device will be described below. The imaging system may be not only a camera aiming mainly for capturing images but also an apparatus auxiliarily having imaging function, such as a personal computer and a personal digital assistant. For example, the camera includes the solid-state imaging device according to the present invention, and a processing unit for processing a signal output from the solid-state imaging device. The processing unit may include, for example, an A/D conversion unit, and a processor for processing digital data output from the A/D conversion unit.

As mentioned above, the solid-state imaging device according to the present invention is capable of restraining the increase in contact resistance with an external terminal at a pad, and reducing metal pollution. The present invention is not limited to the above-mentioned configurations but may be suitably modified. Specifically, the conductive type may be reversed, circuits may be of reverse conductive type, additional wiring layers and interlayer insulating films may be provided, and the single-damascene structure can be changed to the dual-damascene structure. The present invention can also be applied to a case where a pad is provided on the back face of the second substrate 121. Further, the configurations according to the above-mentioned exemplary embodiments can be suitably combined with each other.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-149485, filed Jun. 30, 2010, which is hereby incorporated by reference herein in its entirety.

REFERENCE SIGNS LIST

301 Pixel portion
302 Peripheral circuit portion
308 First member
309 Second member
149 First wiring structure
150 Second wiring structure
312 Pad portion
313 Pad
101 First substrate
121 Second substrate
100 Opening
X Bonding face

The invention claimed is:

1. A solid-state imaging device comprising:
a first substrate provided with photoelectric conversion elements;
a first wiring layer including wirings made mainly of copper;
a second substrate provided with at least a part of peripheral circuits; and
a second wiring layer including wirings made mainly of copper,
wherein the first substrate, the first wiring layer, the second wiring layer, and the second substrate are provided in this order,
wherein a wiring made mainly of copper in the first wiring layer is bonded with a wiring made mainly of copper in the second wiring layer, and
wherein the solid-state imaging device includes a pad for outputting a signal based on electric charges of the photoelectric conversion elements, the pad being formed of a conductive element made mainly of aluminum, and
wherein the pad is provided in the same layer as a wiring layer disposed between the first substrate and the second substrate.

2. The solid-state imaging device according to claim 1, wherein the second substrate is provided with an amplifier transistor for outputting a signal generated based on electric charges of the photoelectric conversion elements, and a reset transistor for resetting the electric charges of the photoelectric conversion elements.

3. An imaging system comprising:
a solid-state imaging device according to claim 1; and
a signal processing circuit configured to process a signal output from the solid-state imaging device.

4. The solid-state imaging device according to claim 1, wherein the peripheral circuits include read-out circuits and control circuits for reading a signal generated based on electric charges of the photoelectric conversion elements.

5. The solid-state imaging device according to claim 1, wherein the first substrate is provided with a transistor.

6. The solid-state imaging device according to claim 5, wherein the second substrate is provided with a circuit for supplying a signal to the transistor.

7. The solid-state imaging device according to claim 1, further comprising a wiring layer which is disposed closer to the first substrate than the first wiring layer is.

8. The solid-state imaging device according to claim 1, further comprising a wiring layer which is disposed closer to the second substrate than the second wiring layer is.

9. The solid-state imaging device according to claim 1, wherein there are more wiring layers between the first wiring layer and the second substrate than between the second wiring layer and the first substrate.

10. The solid-state imaging device according to claim 1, wherein the pad is provided in the other layer than at least one of the first wiring layer and the second layer.

11. The solid-state imaging device according to claim 1, wherein a plug coupled with the wiring in the first wiring layer is positioned on the first substrate's side of the first wiring layer, and a plug coupled with the wiring in the second wiring layer is positioned on the second substrate's side of the second wiring layer.

12. The solid-state imaging device according to claim 1, wherein each of the first wiring layer and the second wiring layer has a damascene structure.

13. The solid-state imaging device according to claim 12, wherein a first insulating film in which wirings of the first wiring layer are embedded is in contact with a second insulating film in which wirings of the second wiring layer are embedded.

14. The solid-state imaging device according to claim 1, wherein a thickness of the first substrate is smaller than a thickness of the second substrate.

15. The solid-state imaging device according to claim 1, wherein the first substrate has an opening over the pad.

16. A solid-state imaging device comprising:
a first substrate provided with photoelectric conversion elements;
a first wiring structure provided on the first substrate;
a second substrate provided with at least a part of peripheral circuits; and a second wiring structure provided the second substrate,
wherein the first substrate, the first wiring structure, the second wiring structure, and the second substrate are provided in this order,
wherein the first wiring structure includes a wiring layer including wirings made mainly of copper,
wherein the second wiring structure includes a wiring layer including wirings made mainly of copper,
wherein wirings made mainly of copper in the wiring layer in the first wiring structure are bonded with wirings made mainly of copper in the wiring layer in the second wiring structure,
wherein the solid-state imaging device includes a pad for outputting a signal based on electric charges of the photoelectric conversion elements, the pad being formed of a conductive element made mainly of aluminum,
wherein the first wiring structure further includes a wiring layer including wirings made mainly of aluminum, and
wherein the pad is provided in the same layer as the wiring layer including wirings made mainly of aluminum.

17. The solid-state imaging device according to claim 16, wherein the wiring layer including wirings made mainly of aluminum is disposed closer to the front face of the first substrate than any other layers in the first wiring structure.

18. The solid-state imaging device according to claim 16, wherein the peripheral circuits include read-out circuits and control circuits for reading a signal generated based on electric charges of the photoelectric conversion elements.

19. A solid-state imaging device comprising:
a first substrate provided with photoelectric conversion elements;
a first wiring structure provided on the first substrate;
a second substrate provided with at least a part of peripheral circuits; and
a second wiring structure provided the second substrate,
wherein the first substrate, the first wiring structure, the second wiring structure, and the second substrate are provided in this order,
wherein the first wiring structure includes a wiring layer including wirings made mainly of copper,
wherein the second wiring structure includes a wiring layer including wirings made mainly of copper,
wherein wirings made mainly of copper in the wiring layer in the first wiring structure are bonded with wirings made mainly of copper in the wiring layer in the second wiring structure, wherein the solid-state imaging device includes a pad for outputting a signal based on electric charges of the photoelectric conversion elements, the pad being-formed of a conductive element made mainly of aluminum,
wherein the second wiring structure further includes a wiring layer including wirings made mainly of aluminum, and
wherein the pad is provided in the same layer as the wiring layer including wirings made mainly of aluminum.

20. The solid-state imaging device according to claim 19, wherein the peripheral circuits includes read-out circuits and control circuits for reading a signal generated based on electric charges of the photoelectric conversion elements.

* * * * *